(12) United States Patent
Chaji

(10) Patent No.: US 12,237,234 B2
(45) Date of Patent: Feb. 25, 2025

(54) ALIGNMENT PROCESS FOR THE TRANSFER SETUP

(71) Applicant: VueReal Inc., Waterloo (CA)

(72) Inventor: Gholamreza Chaji, Waterloo (CA)

(73) Assignee: VueReal, Waterloo (CA)

( * ) Notice: Subject to any disclaimer, the term of this patent is extended or adjusted under 35 U.S.C. 154(b) by 569 days.

(21) Appl. No.: 17/613,259

(22) PCT Filed: May 22, 2020

(86) PCT No.: PCT/IB2020/054911
§ 371 (c)(1),
(2) Date: Nov. 22, 2021

(87) PCT Pub. No.: WO2020/234850
PCT Pub. Date: Nov. 26, 2020

(65) Prior Publication Data
US 2022/0223483 A1     Jul. 14, 2022

Related U.S. Application Data

(60) Provisional application No. 62/930,982, filed on Nov. 5, 2019, provisional application No. 62/851,189, filed on May 22, 2019.

(51) Int. Cl.
*H01L 25/075* (2006.01)
*H01L 21/66* (2006.01)

(52) U.S. Cl.
CPC .......... *H01L 22/20* (2013.01); *H01L 25/0753* (2013.01); *H01L 2223/54426* (2013.01)

(58) Field of Classification Search
CPC ............................ H01L 22/20; H01L 25/0753
See application file for complete search history.

(56) References Cited

U.S. PATENT DOCUMENTS

| | | | |
|---|---|---|---|
| 5,496,777 A | 3/1996 | Moriyama | |
| 6,133,641 A | 10/2000 | Hamada et al. | |
| 9,871,001 B2 * | 1/2018 | Liou | H01L 23/544 |
| 11,540,399 B1 * | 12/2022 | Brewer | H05K 3/3431 |
| 11,842,905 B2 * | 12/2023 | Sugaya | H01L 22/20 |
| 11,997,303 B2 * | 5/2024 | Liu | H04N 19/543 |
| 2008/0013679 A1 | 1/2008 | Nakagawa | |

(Continued)

FOREIGN PATENT DOCUMENTS

| | | |
|---|---|---|
| CN | 1190790 A | 8/1998 |
| CN | 102214594 A | 10/2011 |

(Continued)

OTHER PUBLICATIONS

PCT International Search Report and Written Opinion relating to application No. PCT/IB2020/054911 dated Aug. 5, 2020.

(Continued)

*Primary Examiner* — Nathan W Ha

(57) ABSTRACT

A method of aligning a first substrate and a second substrate comprises positioning the first substrate having at least a first alignment mark in close proximity to the second substrate having at least a second alignment mark, measuring an alignment value between the first and second alignment marks of both the first and second substrate; and adjusting the position of the first substrate and the second substrate based on the measured alignment value.

25 Claims, 4 Drawing Sheets

(56) References Cited

U.S. PATENT DOCUMENTS

| | | | |
|---|---|---|---|
| 2010/0163404 A1* | 7/2010 | De | C23C 14/042 204/192.12 |
| 2011/0001962 A1* | 1/2011 | Sasazawa | H01L 22/10 356/237.2 |
| 2012/0135600 A1* | 5/2012 | Lin | H01L 22/10 716/52 |
| 2012/0287357 A1 | 11/2012 | Masaki | |
| 2013/0037838 A1* | 2/2013 | Speier | H01L 22/10 118/620 |
| 2013/0249063 A1 | 9/2013 | Shibata et al. | |
| 2015/0085169 A1* | 3/2015 | Igarashi | H01L 25/042 348/294 |
| 2015/0087088 A1* | 3/2015 | Fujimori | H01L 27/14618 438/15 |
| 2015/0276369 A1* | 10/2015 | Kneezel | G03F 9/7076 324/693 |
| 2015/0276638 A1* | 10/2015 | Spath | G01N 27/226 324/697 |
| 2015/0276640 A1* | 10/2015 | Spath | B25J 13/087 29/714 |
| 2015/0279748 A1* | 10/2015 | Spath | H01L 21/78 324/697 |
| 2015/0303119 A1* | 10/2015 | Tamaso | H01L 21/02378 438/14 |
| 2015/0333234 A1* | 11/2015 | Speier | H01L 33/50 118/620 |
| 2017/0194397 A1 | 7/2017 | Kim | |
| 2017/0323854 A1* | 11/2017 | Liou | H01L 22/20 |
| 2019/0146363 A1* | 5/2019 | Mase | G03F 9/7011 355/67 |
| 2019/0378799 A1* | 12/2019 | Wagenleitner | H01L 21/681 |
| 2020/0020553 A1* | 1/2020 | Otsuka | H01L 21/6833 |
| 2020/0055729 A1* | 2/2020 | Wagenleitner | H01L 23/544 |
| 2020/0075360 A1* | 3/2020 | Kim | H01L 21/67092 |
| 2020/0174383 A1* | 6/2020 | Povazay | G03F 7/706 |
| 2021/0050243 A1* | 2/2021 | Otsuka | H01L 21/02002 |
| 2021/0229393 A1* | 7/2021 | Saito | G02B 3/0012 |
| 2021/0320024 A1* | 10/2021 | Yamauchi | H01L 21/681 |
| 2022/0277979 A1* | 9/2022 | Yamasaki | B23K 20/02 |
| 2022/0285196 A1* | 9/2022 | Yamasaki | H01L 21/67092 |
| 2022/0368301 A1* | 11/2022 | Fukumitsu | H05K 3/00 |
| 2023/0378121 A1* | 11/2023 | Matsuo | H01L 24/94 |
| 2024/0047414 A1* | 2/2024 | Burggraf | H01L 24/80 |
| 2024/0168229 A1* | 5/2024 | McKee | G02B 6/12004 |
| 2024/0168301 A1* | 5/2024 | Slupeiks | G02B 27/017 |
| 2024/0170475 A1* | 5/2024 | Fukuzumi | H01L 21/3205 |
| 2024/0171710 A1* | 5/2024 | Pertierra | H04N 9/3185 |
| 2024/0173355 A1* | 5/2024 | Pavel-Dinu | C12N 15/907 |
| 2024/0173667 A1* | 5/2024 | Seifert | B01D 53/04 |
| 2024/0175172 A1* | 5/2024 | Fujisawa | D03D 13/004 |
| 2024/0175877 A1* | 5/2024 | Patil | G01N 33/6854 |
| 2024/0176072 A1* | 5/2024 | Komljenovic | G02B 6/12004 |
| 2024/0176084 A1* | 5/2024 | Ecton | G02B 6/428 |
| 2024/0176231 A1* | 5/2024 | Yamashita | G03F 7/0002 |
| 2024/0176971 A1* | 5/2024 | Inoue | G06K 15/4065 |
| 2024/0177323 A1* | 5/2024 | Tanaka | H04N 23/681 |
| 2024/0178235 A1* | 5/2024 | Tang | H01L 27/124 |
| 2024/0178357 A1* | 5/2024 | Lin | H01L 24/92 |
| 2024/0178704 A1* | 5/2024 | Bharadwaj | H02J 50/23 |
| 2024/0178749 A1* | 5/2024 | Cheng | H02M 3/1582 |
| 2024/0179314 A1* | 5/2024 | Jhu | H04N 19/13 |
| 2024/0179402 A1* | 5/2024 | Nick | G06K 7/10722 |
| 2024/0179794 A1* | 5/2024 | Ji | H04W 52/0229 |
| 2024/0179946 A1* | 5/2024 | Yamazaki | G09F 9/30 |

FOREIGN PATENT DOCUMENTS

| | | |
|---|---|---|
| CN | 103325669 A | 9/2013 |
| CN | 10428208 A | 1/2015 |
| EP | 2375442 A1 | 12/2011 |

OTHER PUBLICATIONS

CN: Chinese Office Action relating to Chinese patent application No. 202080036397.3, dated Nov. 18, 2022.

SIPO: Chinese Office Action relating to Chinese patent application No. 202080036397.3, dated Nov. 18, 2022.

SIPO: Chinese Office Action relating to Chinese patent application No. 202080036397.3, dated Jun. 1, 2023.

* cited by examiner

ALIGNMENT PROCESS FOR THE TRANSFER SETUP

CROSS-REFERENCE TO RELATED APPLICATIONS

This application claims benefit of and priority to U.S. Provisional Patent Application No. 62/930,982, filed Nov. 5, 2019 and U.S. Provisional Patent Application No. 62/851,189, filed May 22, 2019, each of which is hereby incorporated by reference herein in its entirety.

BACKGROUND AND FIELD OF THE INVENTION

The present disclosure relates to an alignment process between a first substrate and the second substrate. In particular, the present invention is directed to an electrical alignment process in combination with optical alignment between the substrates.

Many micro devices including light emitting diodes (LEDs), organic LEDs (OLEDs), sensors, solid state devices, integrated circuits, microelectromechanical systems (MEMS), and other electronic components are typically fabricated in batches, often on planar substrates. To form an operational system, micro devices from at least one donor substrate need to be selectively aligned and bonded to a receiver substrate. Various alignment techniques may be employed for wafers to be aligned including an optical alignment.

The challenge of alignment over large area substrates is more complicated as some of the techniques used in small substrates cannot be directly transferred to such applications.

SUMMARY

An object of the present invention is to overcome the shortcomings of the prior art and to replace or enhance conventional optical alignment processes.

According to one embodiment, an electrical alignment process may be provided for aligning a first (or temporary) substrate and a second substrate. The method comprises: positioning the first substrate having at least a first alignment mark in close proximity to the second substrate having at least a second alignment mark, measuring an alignment value between the first and second alignment marks of both the first and second substrate; and adjusting the position of the first substrate and the second substrate based on the measured alignment value.

In one case, the substrates can be a backplane, an intermediate substrate, a donor substrate, mask, or other form of substrates. In this disclosure, for example, the first substrate may comprise a donor substrate and the second substrate may comprise a receiver substrate.

In one case, the alignment marks on the donor substrate and the alignment marks on the receiver substrate facilitates the measurement of an alignment value. The position of the two substrates may be adjusted to either maximize, minimize or equalize the alignment value for each alignment mark.

In one embodiment, the alignment marks can be plates forming capacitance if brought close together. In this case, the alignment value (or inductance) between the alignment plates on the donor and the alignment plates on the receiver substrate is maximized. In another case, either substrate may be moved to maximize the capacitance (or other values) between the plates.

In another embodiment, the alignment marks can be charged trapped on the surface of one substrate and a plate on the surface of the other substrate.

In some embodiments, the alignment marks can be electrical signals on one surface of one substrate and receiver on the surface of the other substrate.

In yet another embodiment, the alignment marks can be shield plate on one substrate and receiver plate on the other substrate. The shield plate blocks the signals from a source to reach the receiver substrate. The shield plates are used as alignment marks on one of the substrates blocking between the source and collector plates on other substrates. In this case, the alignment value can be minimized to make the two substrates aligned.

In another case, the value is equalized between few alignment corresponding alignment marks between the donor substrate and the receiver substrate.

In one embodiment, the plates can be conductive or charge layers. In another embodiment, there can be multiple plates in different orientations forming the alignment mark.

In one embodiment, there can be multiple (e.g. four) plates on one substrate and at least one plate on the other substrate. In one case, the value (e.g. capacitance or charge reading) for the multiple plates and the at least one plate on the other substrate is equalized by moving either substrate.

In another case, the value between multiple alignment marks (or different sections of a single alignment mark) is equalized.

In one embodiment, the electrical alignment mark can be also used as an initial optical alignment mark.

The foregoing and additional aspects and embodiments of the present disclosure will be apparent to those of ordinary skill in the art in view of the detailed description of various embodiments and/or aspects, which are made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Use of the same reference numbers in different figures indicates similar or identical elements.

Figure 1A:
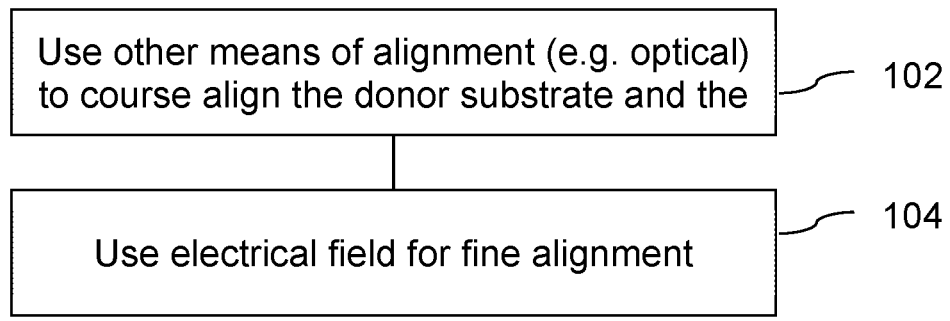
FIG. 1A shows a series of steps of an alignment process of two wafers in accordance with an embodiment of the present invention.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure covers all modifications, equivalents, and alternatives falling within the spirit of the invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

In LED display applications, where display pixels are single device LEDs, each LED is bonded to a driving circuit which controls the current flowing into the LED device. Here, the driving circuit may be a thin film transistor (TFT) backplane, a system substrate or a display wafer conventionally used in LCD or OLED display panels. Due to the typical pixel sizes (10-50 µm), bonding may be performed at a wafer-level scale. In this scheme, an LED wafer consists of isolated individual LED devices that are transferred and aligned, and bonded to a backplane or a display wafer which is compatible with an LED wafer pixel sizes and pitches. Various alignment techniques may be employed for wafers to be aligned including a conventional optical alignment.

The present invention provides an electrical alignment process to replace or enhance the conventional optical alignment process. The electrical alignment process of this disclosure measurement is done through measurement of an alignment value between the substrates. The alignment value may comprise a capacitance value, inductance value, charge value, or another electrical signal value between the substrates. In this case, the alignment marks on the donor substrate and the alignment marks on the receiver substrate may facilitate the measurement of the alignment value. The substrate can be a backplane, an intermediate substrate, a donor substrate, mask, or other form of substrates.

FIG. 1A shows a series of steps of an alignment process between the first substrate and second substrate with an embodiment of the present invention. In one example, the first substrate may be a display substrate/receiver substrate and the second substrate may comprise a cartridge/donor wafer or a mask. The method 100 comprises steps that may be completed in any particular order to achieve a desired state. Here, the first substrate (e.g., a receiver substrate) and the second substrate (e.g. a donor substrate) may be provided. In step 102, in an initial step of aligning the substrates, the means of alignment (e.g. optical) to course align the donor substrate and the receiver substrate may be used. In the next step 104, electrical or magnetic alignment using electric signal/parameter (or magnetic signal) may be used for fine alignment. The alignment can be achieved by maximizing the alignment value that can be an electrical signal (e.g. capacitance), or minimizing the electrical signal (e.g. by shielding the signal generated by a source) or equalizing the electrical signals (e.g. where multiple detectors measures the alignment signal associated with multiple alignment marks or different part of one alignment mark). In another case, the alignment value can be magnetic signal. Here, the alignment can be achieved by maximizing the magnetic signal (e.g. induction) or minimizing a magnetic signal (e.g. by shielding the magnetic signal from a source) or equalizing the magnetic signals (e.g. multiple magnetic sources or detectors). Therefore, there can be different type of alignment marks as follow 1) The alignment marks that create electrical or magnetic components such as capacitance or inductance components. In this case the absolute value of the signal at each moment is measured as alignment value.
2) The alignment marks that shield an electrical signal. In this case the effect of shielding at each moment is measured as the alignment value.

Multiple of each alignment mark can be used to enhance the alignment process.

Figure 1B:
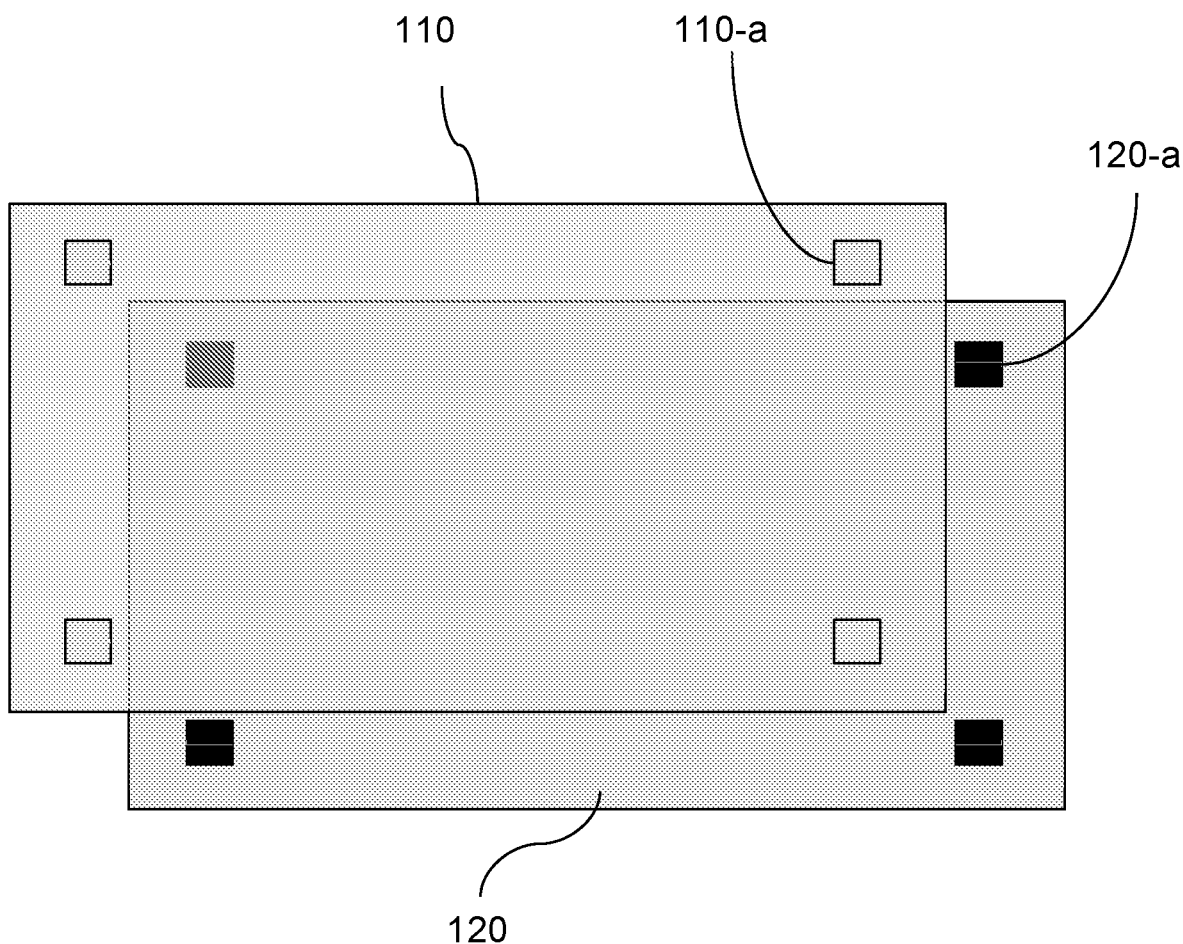
FIG. 1B shows a perspective view of an example alignment process in accordance with an embodiment of the present invention.

FIG. 1B shows a perspective view of an example alignment process in accordance with an embodiment of the present invention. Here, a first substrate 120 and a second substrate 110 may be provided. There are alignment marks (110-*a*, 120-*a*) provided on the substrates. In this case, the first substrate has alignment marks 120-*a* and the second substrate has alignment mark 120-*a* that facilitates the measurement of the alignment value.

Alignment Process

For faster and more accurate alignment, several alignment marks described before (electrical/magnetic components or electrical/magnetic shielding) can be used across the two substrates for faster alignment value associated with these alignment marks. The alignment can be done based on the absolute alignment value associated with each alignment mark or the rate of change in the alignment values.

In one case, the substrates move in respect to each other in different directions (e.g. up, down, left, right) and then, the effect of the moving is measured on each alignment value associated with different alignment marks across the substrates. Based on that, the position of the two substrates may be adjusted to either maximize, minimize, or equalize the alignment values for each alignment mark based on the type of alignment marks. This process can be repeated to achieve a change in the alignment values less than a threshold value.

In another case, the alignment value for each alignment mark is extracted at the current position of the two substrates in respect to each other. Based on the values, the misalignment is calculated, and the substrates are positioned based on the calculated misalignment value. This process can be repeated to achieve a change in the alignment values less than a threshold.

Alignment Marks

In one embodiment, different alignment marks can be used for the aforementioned process.

In one case, the alignment marks on the donor substrate and receiver substrate can be metal plates forming capacitance if brought close together. Since the capacitance is mainly dominated by the overlap area between the two plates, the misalignment between the plates will affect the capacitance value which can be extracted as alignment values.

In another case, the alignment mark may include trapped charge on the surface of one substrate (e.g., donor substrate) or magnetic material on one of the substrates. The charge (or magnetic field) can be read by an electrode on the other substrate. The electrode can be a plate on the surface of the other substrate (e.g., receiver substrate). The effect of charge on the electrode is a function of the overlap area. Therefore, the detected charge effect can be used as an alignment value. In this case, the alignment value between the alignment plates on the donor and the alignment plates on the receiver substrate is maximized.

In one embodiment, the alignment marks can be electrical signals on one surface and receiver on another surface.

In another embodiment, the alignment mark can be a shield plate on one substrate and receiver plate on the other substrate. The shield plate blocks the signals from a source to reach the receiver substrate. The shield plates are used as alignment marks on one of the substrates blocking between the source and collector plates on other substrates. In this case, the alignment value can be minimized to make the two substrates aligned.

Figure 2A:
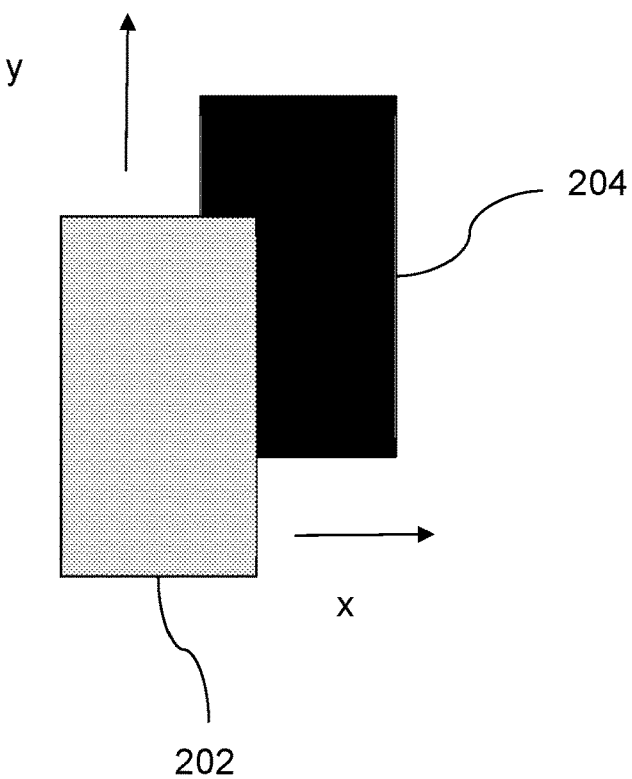
FIG. 2A shows a perspective view of an example alignment process in accordance with an embodiment of the present invention.

FIG. 2A shows a perspective view of an example alignment process for an LED transfer machine in accordance with an embodiment of the present invention. Here, the donor substrate and receiver substrates may be placed on the donor alignment plate 202 and the receiver alignment plate 204, respectively.

In one case, the plates 202, 204 may be metal plates. These metal plates may be brought close together to form capacitance. These metal plates may be moved to maximize the capacitance (or other electrical values) between the two plates. The plates can be optically aligned initially. Since the capacitance is mainly dominated by the overlap area between the two plates, the misalignment between the plates will affect the capacitance value which can be extracted as alignment values. In case of a low value of capacitance, the position of plates can be shifted to maximize the value.

In one embodiment, the plates 202, 204 can be conductive or charge layers. In another embodiment, there can be multiple plates in different orientations forming the alignment mark.

Figure 2B:
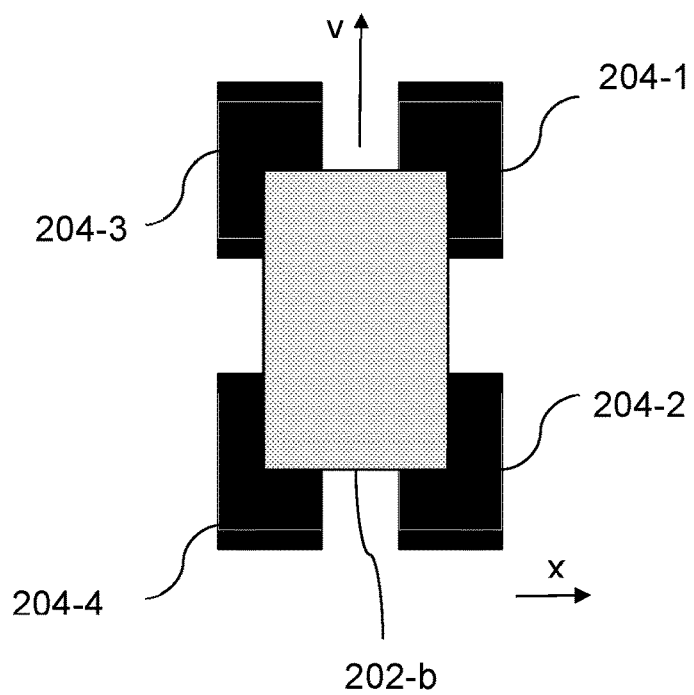
FIG. 2B shows a perspective view of an example alignment process in accordance with an embodiment of the present invention.

FIG. 2B shows a perspective view of an example alignment process in accordance with an embodiment of the present invention.

In one embodiment, there can be multiple (e.g. four) plates (204-1, 204-2, 204-3 and 204-4) on one substrate and at least one plate 202-b on the other substrate. In one case, the value (e.g. capacitance or charge reading) for the multiple plates and the at least one plates on the other substrate is equalized by moving either substrate.

According to one embodiment, a method of aligning a first substrate and a second substrate may be provided. The method may comprise positioning the first substrate having at least a first alignment mark in close proximity to the second substrate having at least a second alignment mark, measuring an alignment value between the first and second alignment marks of both the first and second substrate; and adjusting the position of the first substrate and the second substrate based on the measured alignment value.

According to another embodiment, wherein measuring the alignment value between the alignment marks of both the first and second substrate comprises: extracting the alignment value at a current position of the substrates; and moving the substrates with respect to each other in different directions to measure a change in the alignment value.

According to some embodiments, the method may further comprise comparing the alignment value to the change in the alignment value; and adjusting the position of the first substrate and the second substrate based on the comparison. Adjusting the change in alignment value may comprise one of: maximizing, minimizing or equalizing the alignment value for each alignment mark.

According to yet another embodiment, the at least one alignment mark on the first substrate and the second substrate may comprise metal plates or capacitive plates. The alignment value may be maximized between the capacitive plates. The at least one alignment mark on the first substrate may comprise charge trapped on a surface of the first substrate and the at least one alignment mark on the second substrate may comprise a plate on the surface of the second substrate. The at least one alignment mark on a first substrate may comprise shield plate on a surface of the first substrate and the at least one alignment mark on the second substrate may comprise a receiver plate on the second substrate. The alignment value may be minimized between the shield plate and the receiver plate.

According to further embodiments, the at least one alignment mark on the first substrate may comprise a plurality of multiple plates on the first substrate and the at least one alignment mark on the second substrate may comprise a metal plate on the second substrate and the alignment value for multiple plates and the metal plate may be equalized by moving one of the first substrate or the second substrate. The alignment value may comprise one of: a capacitance value, inductance value, a charge value, or another electrical signal value between the substrates.

Figure 3A:
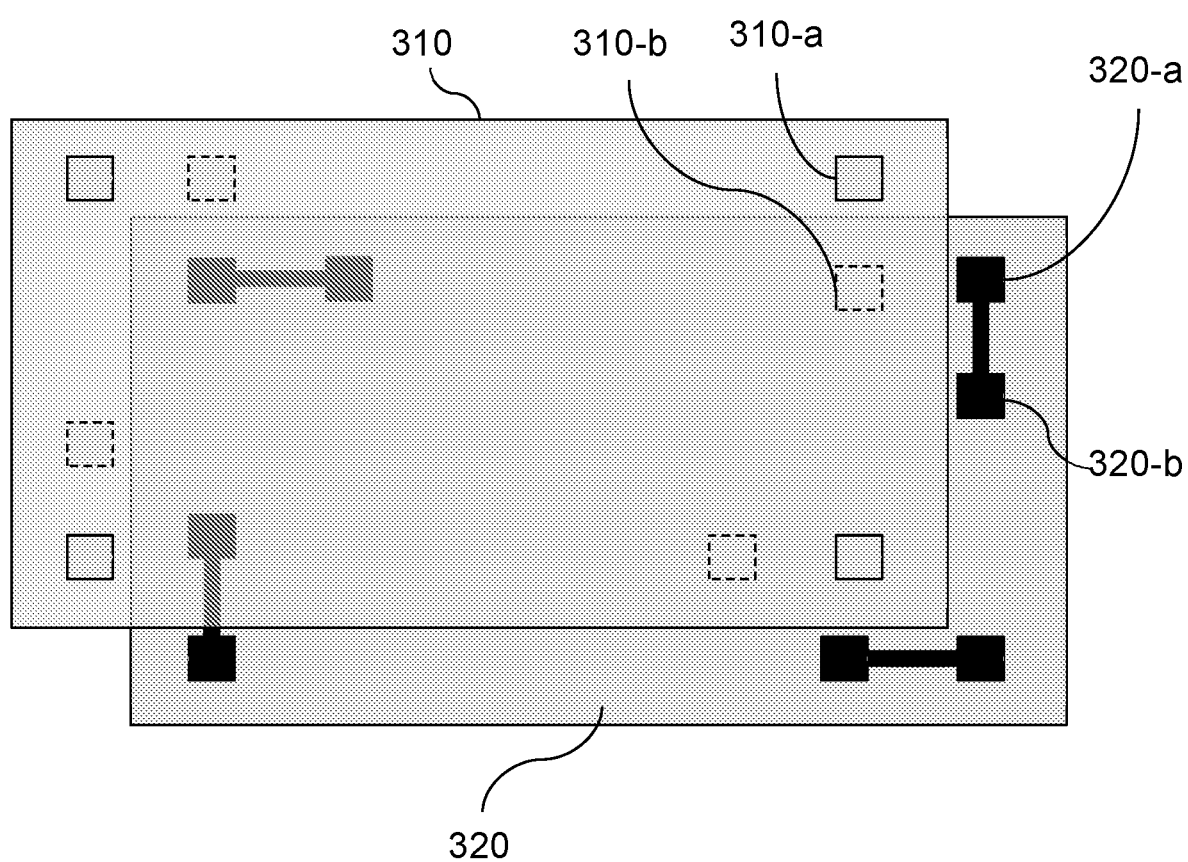
FIG. 3A shows detector and source signal on one substrate and transfer medium on another substrate.

In one embodiment, the detector and the signal source are on one substrate and a transfer medium is formed on the other substrate. Here, the signal is passed through the transfer medium from the source to the detector. If the source and detectors are aligned with the transfer medium, the signal detected by the detector will be maximized. FIG. 3A shows one implementation of this method. Here, the substrate 310 has both the signal source 310-b and the detector 310-a. The mediums 320a, 320b are in the other substrate 320. The transfer medium can be a conductive trace. Here, the combination of signal, detector and transfer medium can be in different orientations to assist in different misalignment signals such as offset and rotation.

Figure 3B:
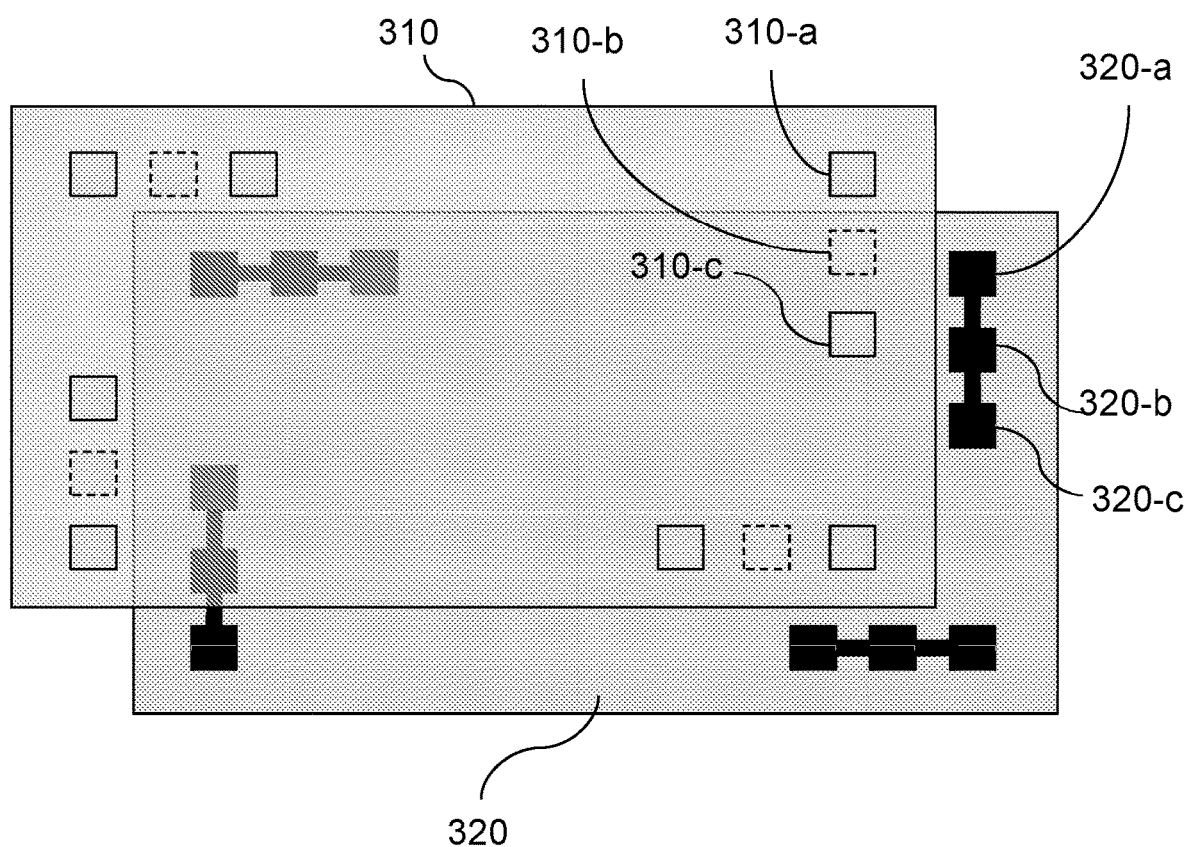
FIG. 3B shows two detectors and source signal on one substrate and transfer mediums on another substrate.

Another implementation demonstrated in FIG. 3B has one signal source 310b and two detectors 310a, 310c for each set and transfer mediums 320a, 320b and 320c. Here a set comprises at least one signal source and at least one detector on one substrate and a transfer medium on another substrate. Here, the signal is passed to the transfer medium and directed to both detectors. The signal received by the two detectors is equalized and maximized. As a result, each set can offer both offset and rotation misalignment. More sets in different orientations can assist in fine tuning the misalignment information. This information can be used to align the substrates. The size of transfer medium and/or the detector and signal can be used to define the alignment accuracy. For example, if the transfer medium is larger than the detector or signal it can be used for coarse alignment. If the size is the same, it can be used for fine alignment.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A method of aligning a first substrate and a second substrate comprising:
   positioning the first substrate in close proximity to the second substrate, wherein the first substrate has at least a first alignment mark comprising four plates and wherein the second substrate has at least a second alignment mark comprising a single plate, and wherein the close proximity is a proximity at which the first alignment mark and the second alignment mark form a capacitance;
   measuring an alignment value between the first and second alignment marks of both the first and second substrate; and
   adjusting the position of the first substrate and the second substrate based on the measured alignment value.

2. The method of claim 1, wherein a detector and signal source are on the first substrate and a transfer medium is formed on the second substrate.

3. The method of claim 2, wherein as the signal source and detector are aligned with the transfer medium, a signal detected by the detector is maximized.

4. The method of claim 3, wherein the transfer medium can be a conductive trace.

5. The method of claim 3, wherein a combination of signal, detector and transfer medium can be in different orientations to assist in different misalignment signals.

6. The method of claim 1, wherein two detectors and signal source are on the first substrate and a transfer medium is formed on the second substrate.

7. The method of claim 6, wherein as the signal source and detector are aligned with the transfer medium, a signal passed to the transfer medium is detected by the two detectors.

8. The method of claim 7, wherein the signal received by both detectors is equalized and maximized such that each detector, signal and medium set assists in offset and rotation misalignment.

9. The method of claim 8, wherein more sets can assist in fine tuning misalignment information.

10. The method of claim 8, wherein a misalignment information is used to align substrates.

11. The method of claim 8, where in a size of the transfer medium, the detector and the signal is used to define an alignment accuracy.

12. The method of claim 8, where in a size of the detector and the signal is used to define an alignment accuracy.

13. The method of claim 11, wherein if the size of the transfer medium is larger than the detector or the signal then coarse alignment is addressed.

14. The method of claim 11, wherein if the size of the transfer medium is the same as the detector or the signal then fine alignment is addressed.

15. The method of claim 1, wherein measuring the alignment value between the alignment marks of both the first and second substrate comprising:

extracting the alignment value at a current position of the substrates; and moving the substrates with respect to each other in different directions to measure a change in the alignment value.

16. The method of claim 15, further comprising:

comparing the alignment value to the change in the alignment value; and adjusting the position of the first substrate and the second substrate based on comparing.

17. The method of claim 15, wherein adjusting the position of the first substrate and the second substrate based on comparing comprises one of: maximizing, minimizing or equalizing the alignment value for each alignment mark.

18. The method of claim 1, wherein the four plates and the single plate are metal plates or capacitive plates.

19. The method of claim 18, wherein the alignment value is maximized between the capacitive plates.

20. The method of claim 1, wherein the first alignment mark comprises charge trapped on a surface of the first substrate and the second alignment mark on the second substrate comprises a metal plate on a surface of the second substrate.

21. The method of claim 1, wherein the first alignment mark comprises a shield plate on a surface of the first substrate and the alignment mark on the second substrate comprises a receiver plate on the second substrate.

22. The method of claim 21, wherein the alignment value is minimized between the shield plate and the receiver plate.

23. The method of claim 1, wherein the single plate is a metal plate.

24. The method of claim 23, wherein the alignment value for the four plates and the single plate is equalized by moving one of the first substrate or the second substrate.

25. The method of claim 1, wherein the alignment value comprises one of: a capacitance value, inductance value, a charge value, or another electrical signal value between the substrates.

* * * * *